(12) United States Patent
Berger et al.

(10) Patent No.: US 7,247,956 B2
(45) Date of Patent: Jul. 24, 2007

(54) PERFORMANCE TEST BOARD

(75) Inventors: Hartmut Berger, Munich (DE); Kapil Gupta, Munich (DE); Georg Eggers, Munich (DE); Claus Peter, Glen Allen, VA (US); Hans-Joachim Kremer, Kurten (DE)

(73) Assignee: Infineon Technologies AG, Munich (DE)

( * ) Notice: Subject to any disclaimer, the term of this patent is extended or adjusted under 35 U.S.C. 154(b) by 98 days.

(21) Appl. No.: 11/000,252

(22) Filed: Nov. 30, 2004

(65) Prior Publication Data

US 2006/0113845 A1    Jun. 1, 2006

(51) Int. Cl.
*G01R 31/00* (2006.01)
(52) U.S. Cl. ...................................... 307/151; 324/765
(58) Field of Classification Search ................. 307/151; 324/765, 415
See application file for complete search history.

(56) References Cited

U.S. PATENT DOCUMENTS 7,053,648 B2 *  5/2006  DeVey ........................ 324/765

\* cited by examiner

*Primary Examiner*—Brian Sircus
*Assistant Examiner*—Adi Amrany
(74) *Attorney, Agent, or Firm*—Jenkins, Wilson, Taylor & Hunt, P.A.

(57) ABSTRACT

Performance Test Board for connecting at least one device under test (DUT) to a test system which has internal power supply sources (IPS) wherein said Performance Test Board (PTB) comprises at least one DC-DC-converter having an input terminal to which several internal power supply sources of said test system are connected in parallel, an output terminal to which a power supply terminal of said device under test (DUT) is connected and a control terminal to which a further internal power supply source of said test system is connected.

18 Claims, 7 Drawing Sheets

State of the Art

State of the Art

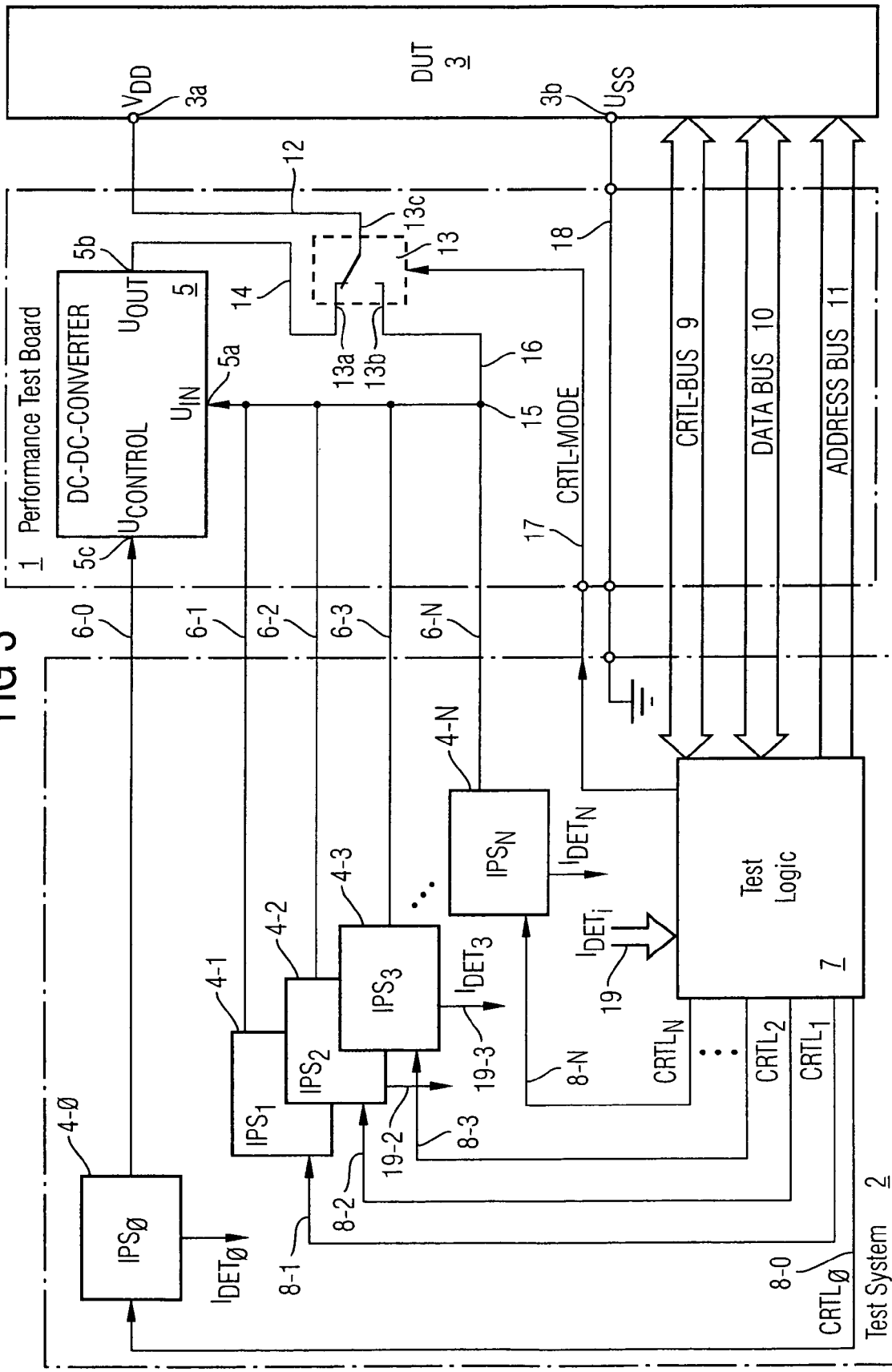

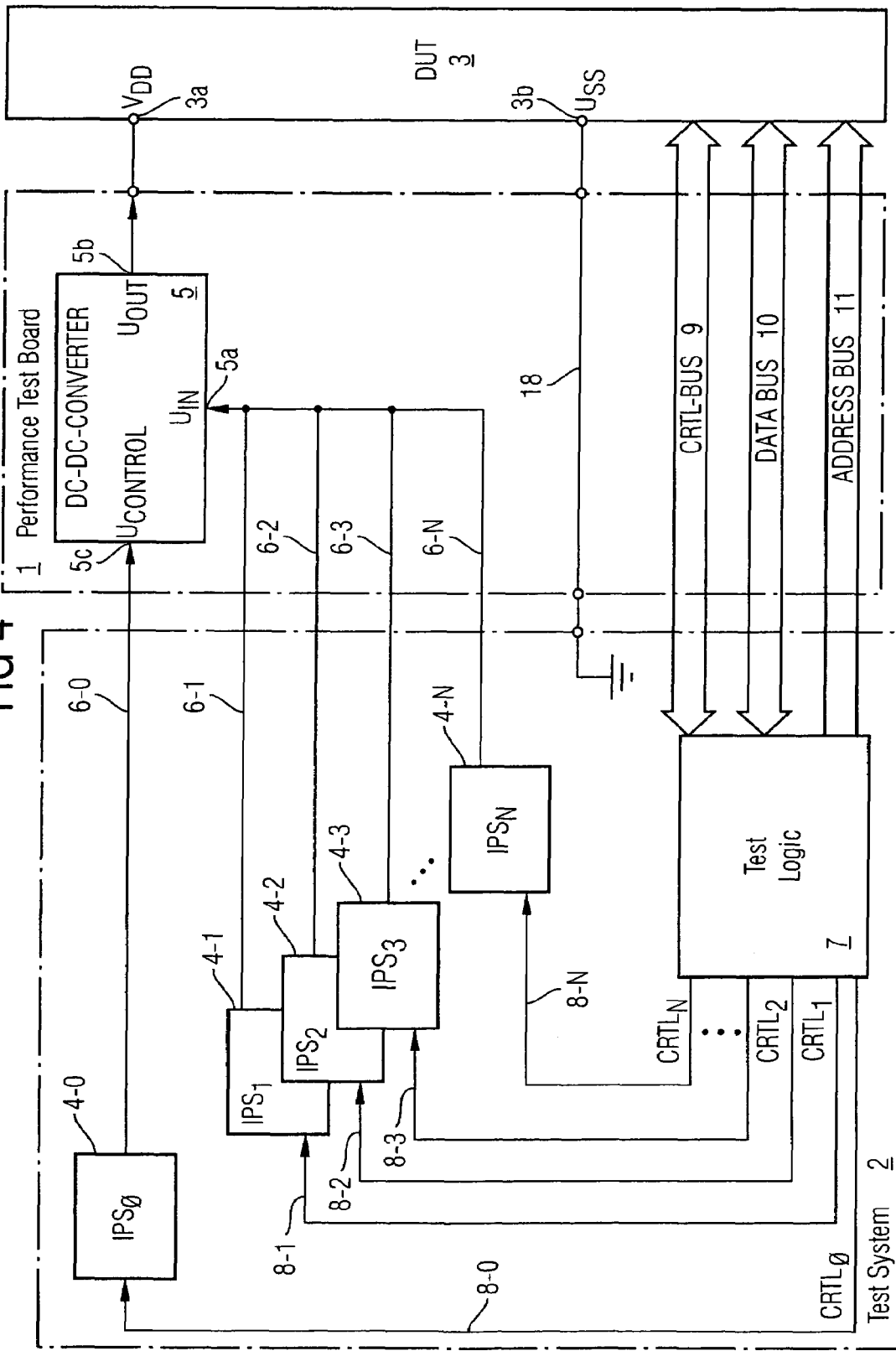

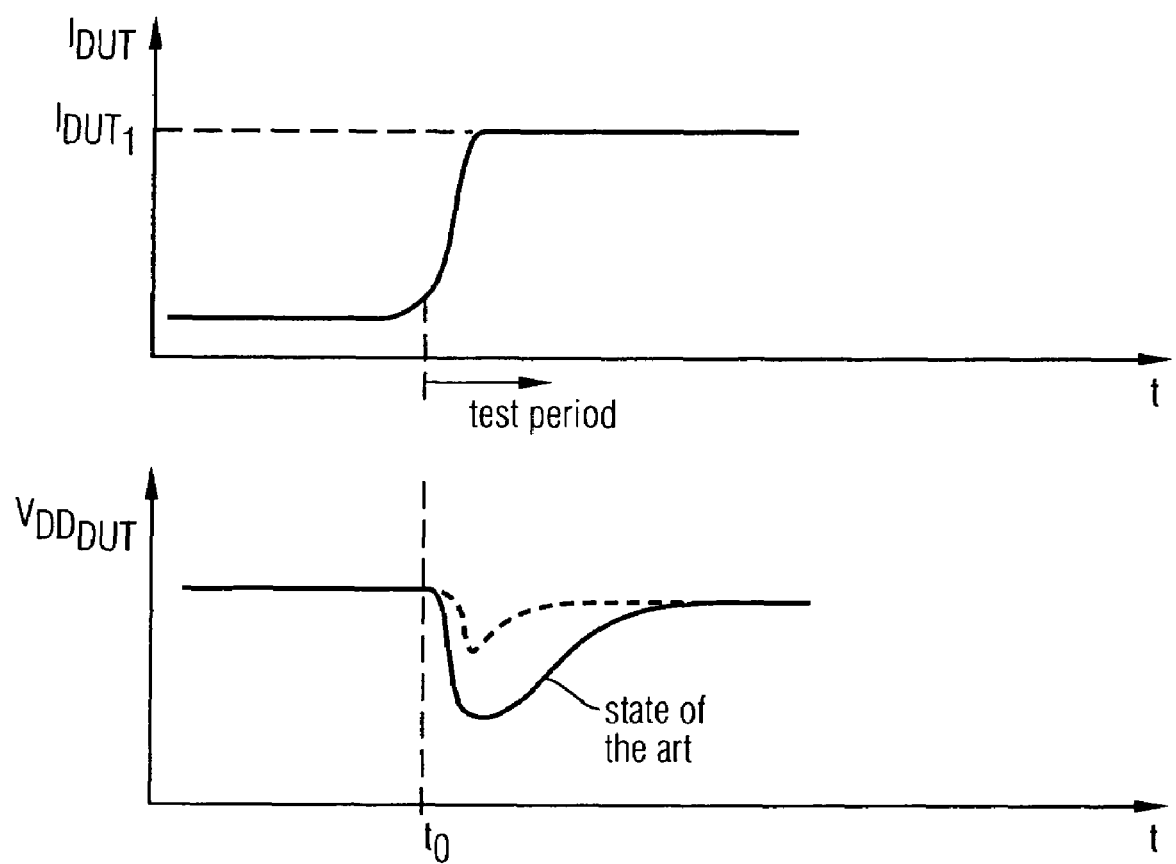

PERFORMANCE TEST BOARD

The invention refers to a Performance Test Board (PTB) for testing devices (DUT: Device Under Test).

TECHNICAL FIELD

The evaluation of the reliability and quality of digital integrated circuits ICs is commonly called testing. Verification is the initial phase in which the first prototype chips are tested to ensure that they match the desired functional specification that is to verify the correctness of the design. Testing refers to the phase when it must be ensured that only defect free production chips are packaged and shipped and when faults arising from manufacturing and/or wear out are detected. Testing methods have to be fast enough to be applied to a large amount of chips during production. Further, testing methods have to take into consideration whether the user concerned has access to large expensive external tester machines. Retesting is done to ensure that components meet design specifications for delays, voltages and power.

BACKGROUND ART

Since the density of circuitry on a chip continues to increase, while the number of IO pins of a chip remains small a serious escalation of complexity is caused and testing is becoming more cost intensive. Integrated circuits Ics should be tested before and after packaging, after mounting on a board and periodically during operation. Different testing methods are necessary for each case.

FIG. 1 shows a test equipment according to the state of the art. The devices to be tested (DUT) are connected to a performance test board (PTB) which is connected to a test system. The IO pins of the device under test are connected to the Performance Test Board to perform predetermined testing procedures. The Performance Test Board is exchangeable for performing different tests for different kinds of devices under test.

FIG. 2 shows the test system according to the state of the art in more detail for one device under test. The device under test (DUT) is connected via the Performance Test Board to the test system. The test system comprises a test logic for generating and evaluating test signals. The device under test is connected via the Performance Test Board by means of a control bus, data bus and an address bus to the test logic. During the test the device under test (DUT) is supplied with power by means of internal power-supply sources (IPS) within the test system. The test system according to the state of the art comprises N internal power supply sources.

To decrease testing costs as many devices under test (DUT) as possible are connected in parallel to the Performance Test Board (PTB). A typical Performance Test Board according to the state of the art is provided for testing eight devices under test (DUT) at the same time. Accordingly several internal power supply sources (IPS) of the test system are connected in parallel within the Performance Test Board to supply all devices under test with sufficient operation current. The devices under test (DUT) are for instance memory modules (DIMMs). The possibility of parallel testing of multiple memory modules is more and more limited by the maximum operation current $I_{op}$ available from the test system's internal power supplies (IPS). The reason for that is that the memory size of the multiple memory modules is rising continuously and the operation clock frequency $f_{clk}$ is also increasing. Consequently the operation current $I_{op}$ of one memory module (DIMM) or device under test (DUT) is continuously increasing. Since the number N of internal power supplies IPS of the state of the art test system equipment is limited the number of devices under test (DUT) connected to a conventional Performance Test Board PTB according to the state of the art as shown in FIG. 2 is decreased to supply all remaining devices under test (DUT) with a sufficient operation current. Since the number of devices under test (DUT) connected to a Performance Test Board at the same time is limited and has even to be diminished for increasing the operation current $I_{op}$ required by each device under test (DUT) the testing costs when using a conventional Performance Test Board PTB are increasing rapidly.

The exchange of a already existing test system having a predetermined number (N) of internal power supply sources IPS by a new test system having more internal power supply sources is in most cases not profitable since the costs of a new test system are very high.

A further trend in the development of integrated circuits ICs is that the supply voltages $V_{DD}$ tend to decrease. One reason for that is that because of the increasing operation currents $I_{op}$ the dissipation heat of one integrated circuit IC is also increasing when the supply voltage $V_{DD}$ is kept constant. By decreasing the supply voltage $V_{DD}$ the dissipation power P of an IC is kept with an certain limit. With the development of memory module generations such as single data rate (SDR) DRAMs to double data rates (DDR) DRAMs or even DDR2 the power supply voltages $V_{DD}$ have dropped from 3.6 volts to 1.8 volts while the operation current $I_{op}$ has more then doubled. The typical test equipment to test the system comprises N=64 internal power supplies IPS to test eight devices under test (DUT) connected to the Performance Test Board PTB at the same time. Accordingly for each device under test DUT eight (N=8) internal power supplies sources (IPS) are provided each generating typically an operation current of 800 mA. Since eight internal power supply sources IPS are connected in parallel each device under test DUT can be supplied with a maximum current of 6.4 Amp. Because of the increasing memory sizes and the increasing operation clock frequencies $f_{clk}$ in many cases a current of 6.4 Amp. is not sufficient since the current requirement of a device under test DUT exceeds this limit.

SUMMARY OF THE INVENTION

Accordingly it is the object of the present invention to provide a Performance Test Board PTB which provides the connected devices under test (DUT) with enough operation current using a conventional test system with a limited number of internal power supply sources IPSs.

This object is achieved by the Performance Test Board having the features of main claim 1.

The invention provides a Performance Test Board for connecting at least one device under test (DUT) to a test system which has internal power supply sources, wherein the Performance Test Board comprises at least one DC-DC converter having an input terminal to which several internal power supply sources of the test system are connected in parallel, an output terminal to which a power supply terminal of said device under test (DUT) is connected and a control terminal to which a further internal power supply source of said test system is connected.

In an alternative embodiment the control terminal of the DC-DC-converter is driven by an internal programmable voltage source such as a Digital-Analog-converter to control the output voltage without the need of an internal power supply connected to the control input.

In a preferred embodiment of the Performance Test Board according to the present invention said at least one DC-DC converter is down-converting a voltage output by the internal power supply sources connected to the input terminal to a predetermined power supply voltage $V_{DD}$ of the device under test (DUT) in response to an adjustable control voltage generated by the further internal power supply source connected to said control terminal of said DC-DC converter.

In a preferred embodiment the adjustable control voltage is adjusted such that the control voltage corresponds to the predetermined power supply voltage (VDD) of the device under test (DUT).

In a preferred embodiment the internal power supply source (IPS) of said test system comprises a controllable voltage source generating an output voltage which is controlled by a digital control signal generated by a test logic of said test system.

In a preferred embodiment the output terminal of said DC-DC-converter is connected to said power supply terminal of the device under test (DUT) via a controllable switch.

In a preferred embodiment the controllable switch is connected via a control line to said test logic of said test system.

In a preferred embodiment the controllable switch connects in a first operation mode the output terminal of the DC-DC-converter to said power supply terminal of said device under test (DUT) and connects in a second operation mode the input terminal of said DC-DC-converter to said power supply terminal of said device under test (DUT) in response to a mode control signal generated by said test logic.

In a preferred embodiment the output voltage of each internal power supply source connected in parallel to said input terminal of said DC-DC-converter is adjusted to a maximum voltage in said first operation mode.

In a preferred embodiment the output voltage of said further internal power supply source connected to said control terminal of said DC-DC-converter is adjusted to the predetermined power supply voltage (VDD) of said device under test (DUT) in said first operation mode.

In a preferred embodiment each internal power supply source of said test system comprises a current detection circuit for detecting the current output by said power supply source.

In a preferred embodiment the current detection circuit of each internal power supply source outputs a current detection signal to said test logic of said test system in said second operation mode.

In a preferred embodiment the output voltage of each internal power supply source connected in parallel to said input terminal of said DC-DC-converter is adjusted to a power supply voltage ($V_{DD}$) of the device under test (DUT) in said second operation.

In a preferred embodiment the output voltage of said further internal power supply source connected to the control terminal of the DC-DC-converter is adjusted to zero in said second operation mode.

In a preferred embodiment the DC-DC-converter comprises
a transistor having a first terminal connected to said input terminal of the DC-DC-converter,
a second terminal connected to said output terminal of the DC-DC-converter,
and a third terminal receiving a pulse width control signal generated by a pulse width control unit,
wherein the pulse length of each signal pulse of said generated pulse width signal is proportional to a comparison result generated by a comparator which compares a voltage applied to said control terminal of said DC-DC-converter with a voltage at the output terminal of said DC-DC-converter.

In a preferred embodiment the transistor is a MOSFET.

In a preferred embodiment the second terminal of said MOSFET is connected via a diode to ground and via a low pass filter (LPF) to said output terminal of said DC-DC-converter.

In a preferred embodiment the low pass filter (LPF) comprises
An inductor between the second terminal of the transistor and said output terminal and
a capacitor between said output terminal and ground.

In the following preferred embodiments of the Performance Test Board PTB according to the present invention are described with reference to the enclosed figures.

BRIEF DESCRIPTION OF THE DRAWINGS

FIG. 3 shows a block diagramm of a preferred embodiment of the Performance Test Board according to the present invention;

FIG. 4 shows a block diagramm of an alternative embodiment of the Performance Test Board according to the present invention;

FIG. 5b shows signal diagram illustrating the functionality of the DC-DC converter as shown in FIG. 5a;

FIG. 6 shows the power supply of a device under test DUT generated by a conventional Performance Test Board and by a Performance Test Board according to the present invention.

DETAILED DESCRIPTION OF THE INVENTION

Figure 1:
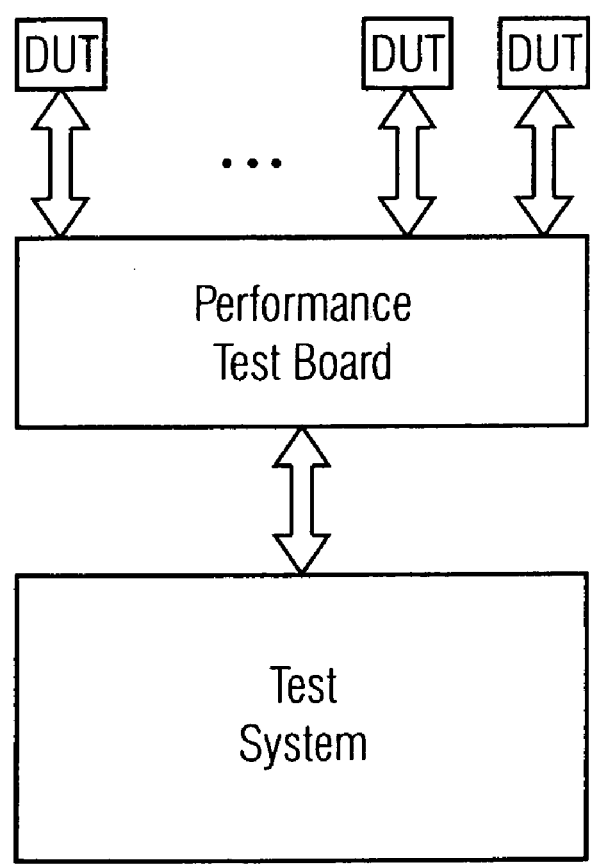
FIG. 1 shows a block diagramm of a test equipment according to the state of the art.
Figure 2:
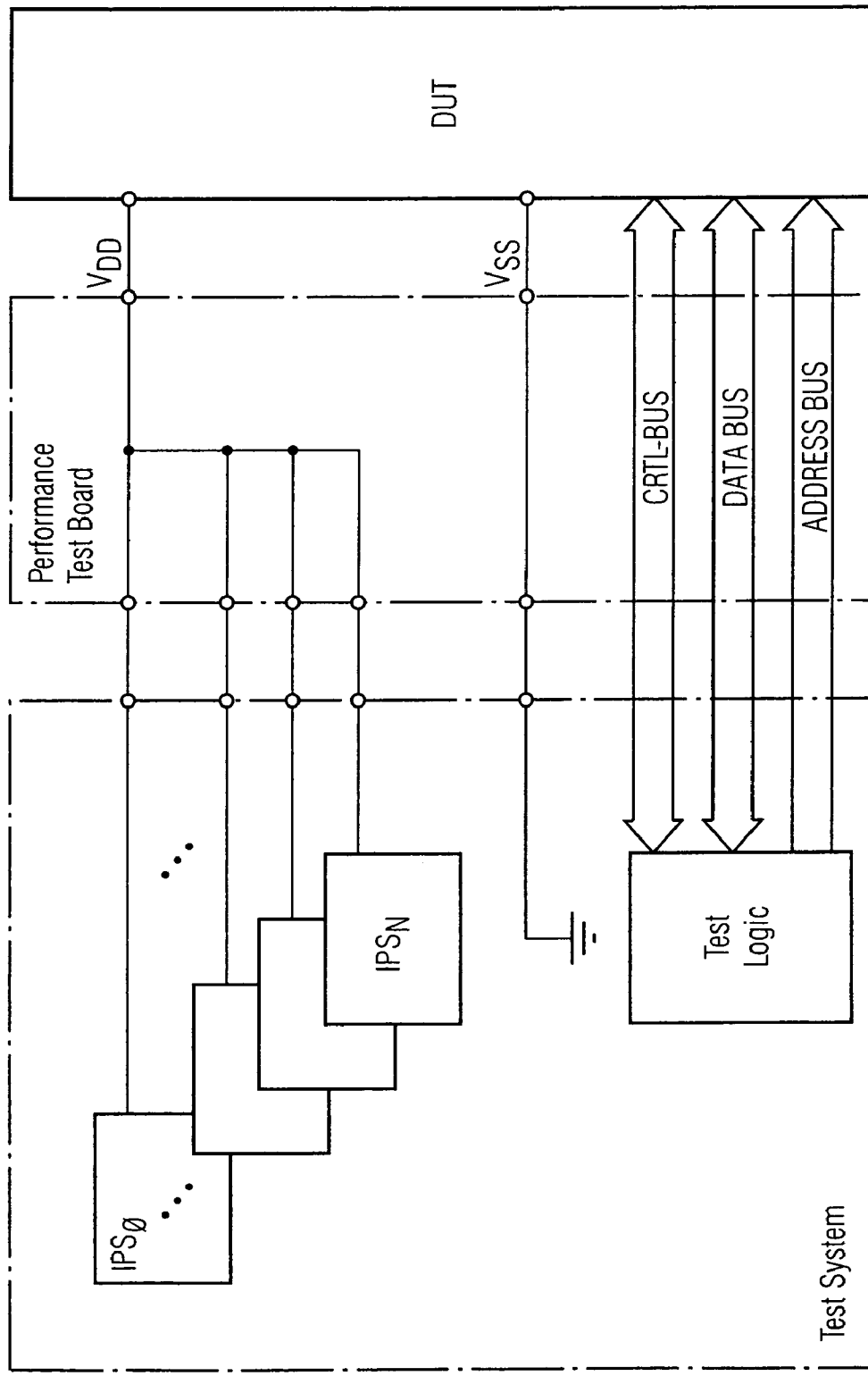
FIG. 2 shows the prior art test equipment of FIG. 1 in more detail.

As can be seen from FIG. 3 the Performance Test Board 1 according to a first embodiment of the present invention is located between the conventional test system 2 and at least one device under test 3. The Performance Test Board 1 connects at least one device under test (DUT) to the test system 2 which has N internal power supply sources 4-1 to 4-N. The Performance Test Board PTB according to the present invention comprises an DC-DC converter 5 having an input terminal 5a, an output terminal 5b and an control terminal 5c. The group of N internal power supply sources 4-1 to 4-N within the test system 2 are connected via lines 6-1 to 6-N in parallel to the input terminal 5a of the DC-DC converter 5. The control terminal 5c of the DC-DC converter 1 connected via a further power supply line 6-0 to a further internal power supply source 4-0 of said test system 2. In a preferred embodiment each internal power supply source (IPS) within the test system 2 comprises a current detection circuit which indicates to a test logic 7 within the test system 2 the current supplied via a line 6-*i* to the DC-DC converter 5. Each internal power supply source 4-*i* within the test system 2 is controlled via a control line 8-*i* by said test logic 7. The test logic 7 adjusts the current of each internal power supply source 4-*i*. The test logic 7 is a complex test logic which is connected via a control bus 9 to all devices under test 3 connected to the Performance Test Board 1. Further the test logic 7 is connected via a bi-directional data bus 10 and a uni-directional address bus 11 to all devices under test 3 connected to the Performance Test Board 1 according to the present invention. The power supply terminal 3*a*, 3*b* of each device under test 3 are also connected to the Performance Test Board 1. In the first embodiment shown in FIG. 3 the positive internal power supply terminal 3*a* of the device under test 3 is connected via a line 12 to a controllable switch 13 which connects either the output terminal 5*b* of the DC-DC-converter 5 to the positive input terminal 3*a* of the device under test 3 or the N internal power supply sources 4-1 to 4-N of the test system 2. The output terminal 5*b* of the DC-DC converter 5 is connected via line 14 to a first terminal 13*a* of the switch 13. The parallel connected power supply sources 4-1 to 4-N of the test system 2 are connected within the Performance Test Board 1 according to the present invention to a node 15. The node 15 is connected via a line 16 to a second terminal 13*b* of the controllable switch 13. The controllable switch 13 connects either the first terminal 13*a* or the second terminal 13*b* to an output terminal 13*c* of said switch in response to a control signal applied from the test logic 7 via a control line 17.

The negative power supply terminal 3*b* of the device under test 3 is connected via power supply line 18 permanently to ground.

The DC-DC converter 5 within the Performance Test Board 1 is down converting the voltage output by the internal power supply sources 4-1 to 4-N connected to the input terminal 5*a* to a predetermined power supply voltage VDD of the device under test 3 in response to the adjustable control voltage generated by the internal power supply source 4-0 which is connected to the control terminal 5*c* of the DC-DC converter 5 in a first operation mode.

The test logic 7 outputs a control mode signal via control line 17 to the switch 13. In a preferred embodiment the switch 13 is a relay circuit mounted on the Performance Test Board 1 according to the present invention. The test logic 7 switches the controllable switch 13 between a first operation mode and a second operation mode. In the first operation mode the output terminal 5*b* of the DC-DC converter 5 is switched to the positive power supply terminal 3*a* of the device under test 3. In the first operation mode the output voltage of the further internal power supply source 4-0 which is connected to the control terminal 5*c* of the DC-DC converter 5 is adjusted to the predetermined power supply voltage VDD of the device under test 3. Further the output voltage of each internal power supply source 4-1 to 4-N which are connected in parallel to the input terminal 5*a* of the DC-DC converter 5 is adjusted by the test logic 7 via control lines 8-1 to 8-N to a maximum voltage. The DC-DC converter 5 down-converts the maximum voltage output by internal power supply sources 4-1 to 4-N to the predetermined power supply voltage VDD of the device under test 3 in response to the adjustable control voltage generated by the internal power supply source 4-0 connected to the control terminal 5-*c* of the DC-DC converter 5. The adjustable control voltage $U_{control}$ is adjusted by the test logic 7 via a control line 8-0 such that the control voltage $U_{control}$ corresponds to the predetermined power supply voltage VDD necessary for operating the device under test.

All internal power supply sources 4-0 to 4-N of the test system 2 comprises an internal controllable voltage source generating an output voltage which is controlled by a digital control signal generated by the test logic 7 of the test system 2.

The operation current $I_{DUT}$ applied to the device under test 3 is given by:

$$I_{DUT} = \eta \frac{U_{in}}{U_{out}} \sum_{i=1}^{N} I_{IPS_i}$$

wherein

η is the efficiency of the DC-DC converter 5;
$U_{in}$ is the input voltage of the DC-DC converter 5;
$U_{out}$ is the output voltage of DC-DC converter 5;
$I_{IPS_i}$ is the output current of an IPS 4-*i*;
with $$U_{in} = k \cdot U_{out} \tag{2}$$

$$I_{DUT} = \eta \cdot k \cdot \sum_{i=1}^{N} I_i \tag{3}$$

wherein k=constant.

In case that the DC-DC converter 5 has a typical efficiency value n=0,8 and in case that seven internal power supply sources 4-1 to 4-N are connected in parallel to the input terminal 5*a* of the DC-DC converter 5 (N=7) each generating an operation current of 0,8 Amp the operation current $I_{DUT}$ applied to the DUT 3 by the DC-DC converter 5 via lines 14, 12 is in the first operation mode of the Performance Test Board 1 given for k=5 by:

$$I_{DUT_{max}} = 0,8 \cdot 5 \cdot 7 \cdot 0,8 \text{ Amp} = 22,4 \text{ Amp} \tag{4}$$

Accordingly the maximum operation current $I_{DUT_{max}}$ which can be supplied by the Performance Test Board 5 to a device under test 3 is significantly increased by employing the DC-DC converter 5 mounted of the Performance Test Board 1. Since the operation current is significantly increased more devices under test 3 can be tested in parallel at the same time thus decreasing test costs. Alternatively by connecting less devices under test 3 to the Performance Test Board 1 it is possible to test devices 3 which need a very high operating current being higher than i.e. 20 Amp using the Performance Test Board 1 according to the present invention as shown in FIG. 3 having an integrated DC-DC converter 5.

In the first embodiment of the Performance Test Board 1 according to the present invention as shown in FIG. 3 the Performance Test Board 1 can be switched to a second operation mode by the test logic 7 by switching to a second operation mode by the test logic 7 by switching the switch 13 in response to a control signal to terminal 13*b*. In this second operation mode the parallel internal power supply sources 4-1 to 4-N of the test system 2 are connected via node 15 directly to the power supply terminal 3*a* of the device under test 3. In the second operation mode the output voltage of each internal power supply source 4-1 to 4-N connected in parallel to the input terminal 5*a* of the DC-DC converter 5 is adjusted to a power supply voltage $V_{DD}$ of the device under test 3. The output voltage of the further internal power supply source 4-0 connected to the control input of the DC-DC converter 5 is made irrelevant in the second operation mode by the test logic 7 via control line 8-0. In the second operation mode when switch 13 is switched to terminal 13b the device under test 3 receives the operation current from the parallel internal power supply sources 4-1 to 4-N connected in parallel to node 15. Each internal power supply source 4-i outputs a detection signal $I_{DUT}$ to the test logic 7 via current detection lines 19. In this second operation mode the test logic 7 can directly measure the operation current drawn by the device under test 3. The operation current drawn by the device under test 3 is the sum of the currents supplied by the N parallel internal power supply sources 4-i:

$$I_{DUT} = \sum_{i=1}^{N} I_{IPS_i} \qquad (5)$$

In this second operation mode a standby current of the device under test 3 can easily be measured. The measurement of the operation currents in the second operation mode is performed by using the current meters provided within the internal power supply sources 4-i.

FIG. 4 shows a second embodiment of the Performance Test Board 1 according to the present invention. In this simplified version of the Performance Test Board 1 the Performance Test Board 1 is not switchable between two operation modes. In this embodiment the Performance Test Board is always in the first operation mode i.e. the output voltage of each internal power supply source connected in parallel to the input terminal 5a of the DC-DC converter is adjusted to a maximum voltage, wherein the output voltage of the internal power supply source 4-0 connected to the control terminal 5c of the DC-DC converter is adjusted to a predetermined power supply voltage VDD of said device under test 3 according to a control signal generated by the test logic 7.

Figure 5A:
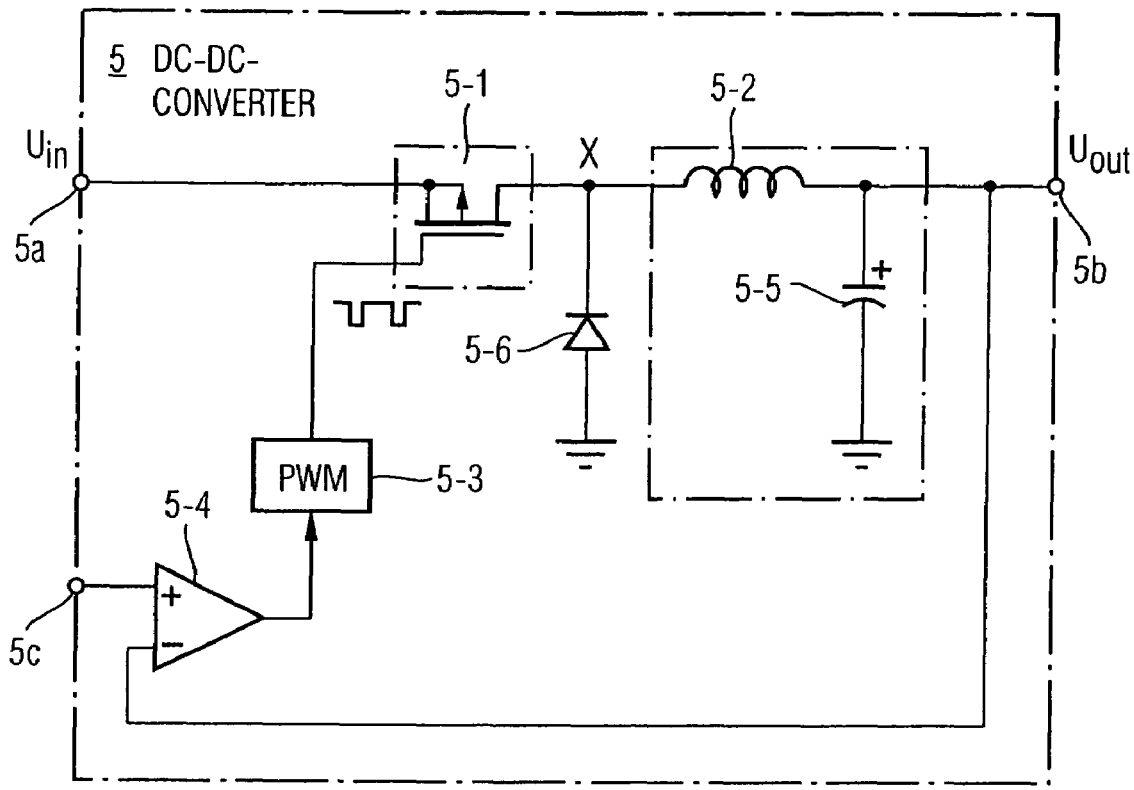
FIG. 5a shows a block diagramm of a DC-DC converter provided within the Performance Test Board according to the present invention.
Figure 5B:
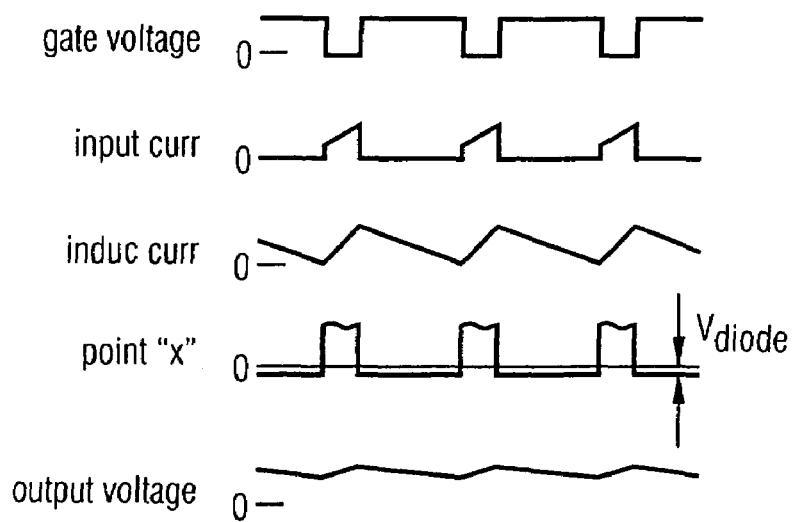

FIG. 5a shows a preferred embodiment of the DC-DC converter 5. The DC-DC converter 5 comprises an input terminal 5a, an output terminal 5b and a control terminal 5c. The DC-DC converter 5 as shown in FIG. 5a is a step-down-converter or buck converter. The DC-DC converter 5 comprises a transistor 5-1 having a first terminal connected to the input terminal 5a via a signal line and a second terminal connected to the output terminal 5b via an inductor 5-2. The transistor 5-1 comprises a third terminal which is connected via a line to a pulse width control unit 5-3 within the DC-DC converter 5. The transistor 5-1 is in a preferred embodiment a MOSFET. The gate terminal of the MOSFET 5 is connected to the pulse width modulation unit 5-3. The DC-DC converter 5 further comprises a comparator 5-4 which compares a voltage applied to the control terminal 5c of the DC-DC converter 5 with a voltage at the output terminal 5b of the DC-DC converter 5. The comparator 5-4 is formed in a preferred embodiment by an operation amplifier having a non inverting input which is connected to the control terminal 5c and an inverting input which is connected via a line to the output terminal 5b of the DC-DC converter 5. The comparator unit 5-4 compares the control voltage $U_{control}$ applied to the control terminal 5c with the output voltage at the output terminal 5b of the DC-DC converter 5 and outputs a comparison result to the pulse width modulation control unit 5-3. The pulse width modulation control unit 5-3 generates a pulse signal which is formed by a sequence of signal pulses wherein the pulse length of each signal pulse is proportional to the comparison result generated by the comparator 5-4. As can be seen in FIG. 5b the pulse width modulation unit 5-3 supplies a gate voltage signal to the gate of the MOSFET 5-1. The transistor 5-1 is switched in response to the applied gate voltage signal and intermittently drives an inductor-capacitor circuit formed by the coil 5-2 and the capacitor 5-5. The inductor or coil 5-4 and the capacitor 5-5 form a low pass filter LPF within the DC-DC converter 5. The pulse current output by the transistor 5-1 builds up a magnetic field in the inductor 5-2. The inductor 5-2 is discharged into the capacitor 5-5 during pulse pauses with the help of a catch diode 5-6.

FIG. 5b shows the input current flowing through the inductor 5-2 and the voltage at the cathode of the catch diode 5-6. Further the output voltage at the output terminal 5b of the DC-DC converter 5 is shown. In a preferred embodiment the DC-DC converter 5 drives a pair of external MOSFET transistors of a size appropriate for the intended test application. These external MOSFETs are provided in a preferred embodiment also on the Performance Test Board 1 according to the present invention.

Any kind of controllable switching device can be used for device 5-1.

FIG. 6 shows the behavior of the supply voltage after start of testing when using a conventional Performance Test Board and when using the Performance Test Board 1 according to the present invention. At a time $t_0$ the device under test 3 is provided with necessary operation current $I_{DUT}$ to start the test procedure. When using a conventional Performance Test Board with the power supplies away from the DUT the voltage supplied to the power supply terminal 3a of the device under test 3 is lowered significantly. Because of the DC-DC converter 5 can be integrated in PTB 1 according to the invention the power supply voltage VDD applied to the device under test 3 is much more stable and only a short and small voltage drop occurs.

The Performance Test Board 1 according to the present invention has the advantage that small DC-DC regulator circuits 5 are located very close to the respective device under test 3. Because of the short wiring between the DUT 3 and the DC-DC converter 5 current changes result in a fast and precise reaction of the DC-DC converter 5. In a preferred embodiment the Performance Test Board 1 comprises for each device under test 3 connected to the Performance Test Board 1 a corresponding DC-DC converter 5. For instance in an embodiment where the Performance Test Board 1 is provided for testing eight devices under test 3 eight DC-DC converter 5 are mounted on the Performance Test Board 1.

The DC-DC converter 5 is a small device typically built from integrated circuits which can be placed close to the device under test 3 and thereby the accuracy of the supply voltage and its reaction time to small changes is improved. Use of DC-DC converters 5 increases the current available to the devices under test 3. This allows increased test parallelism, higher operating speeds during tests. Further it is possible to use the test system 2 for devices 3 wherein the power consumption of the devices 3 is higher than the original limits of the test system 2. Consequently the already existing test system 2 can also be used for devices 3 which have a higher power consumption than former generations of components. In particular memory modules DIMM with a high power consumption can be tested with a conventional test system 2 when using the Performance Test Board 1 according to the present invention.

Figure 7:
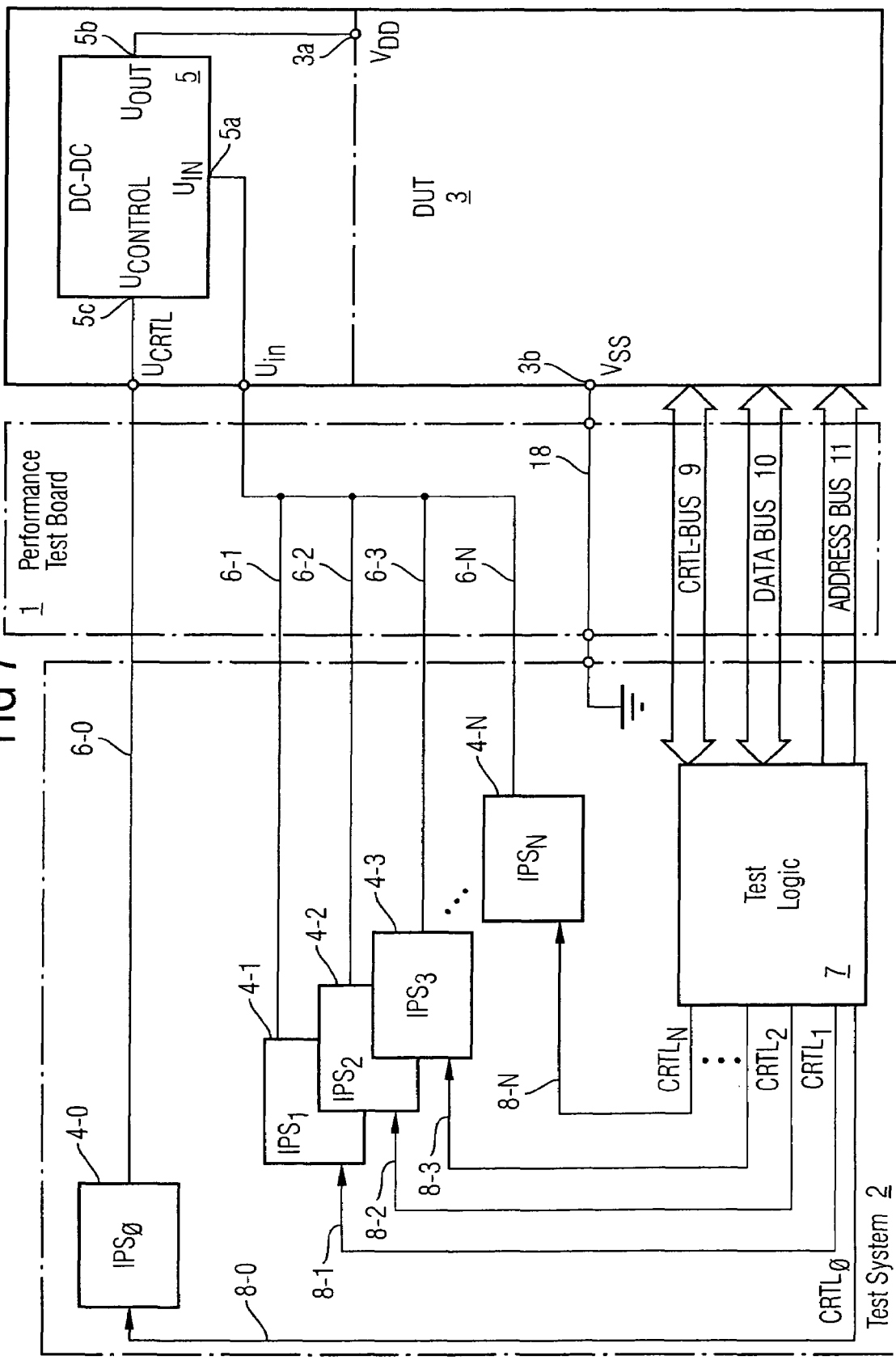
FIG. 7 shows the further embodiment of a performance test board for a device under test having an integrated DCDC-converter.

In an alternative embodiment it is also possible to integrate the DC-DC converter 5 within the device under test 3 to simply testability of the device under test 3. FIG. 7 shows an embodiment wherein the DC-DC converter 5 is integrated into the device under test 3.

What is claimed is:

1. Performance Test Board for connecting at least one device under test to a test system which has internal power supply sources wherein said Performance Test Board comprises at least one DC-DC-converter having an input terminal to which several internal power supply sources of said test system are connected in parallel, an output terminal to which a power supply terminal of said device under test is connected and a control terminal to which a further internal power supply source of said test system is connected.

2. The Performance Test Board according to claim 1 wherein the at least one DC-DC-converter is down converting a voltage output by the internal power supply sources connected to said input terminal to a predetermined power supply voltage of the device under test in response to an adjustable control voltage generated by said further internal power supply source connected to said control terminal of said DC-DC-converter.

3. The Performance Test Board according to claim 2 wherein the adjustable control voltage is adjusted such that the control voltage corresponds to the predetermined power supply voltage of the device under test.

4. The Performance Test Board according to claim 1 wherein each internal power supply source of said test system comprises a controllable voltage source generating an output voltage which is controlled by a digital control signal generated by a test logic of said test system.

5. The Performance Test Board according to claim 1 wherein the output terminal of said DC-DC-converter is connected to said power supply terminal of the device under test via a controllable switch.

6. The Performance Test Board according to claim 5 wherein the controllable switch is connected via a control line to said test logic of said test system.

7. The Performance Test Board according to claim 5 wherein the controllable switch connects in a first operation mode the output terminal of the DC-DC-converter to said power supply terminal of said device under test and connects in a second operation mode the input terminal of said DC-DC-converter to said power supply terminal of said device under test in response to a mode control signal generated by said test logic.

8. The Performance Test Board according to claim 7 wherein the output voltage of each internal power supply source connected in parallel to said input terminal of said DC-DC-converter is adjusted to a maximum voltage in said first operation mode.

9. The Performance Test Board according to claim 7 wherein the output voltage of said further internal power supply source connected to said control terminal of said DC-DC-converter is adjusted to the predetermined power supply voltage of said device under test in said first operation mode.

10. The Performance Test Board according to claim 1 wherein each internal power supply source of said test system comprises a current detection circuit for detecting the current output by said power supply source.

11. The Performance Test Board according to claim 10 wherein the current detection circuit of each internal power supply source outputs a current detection signal to said test logic of said test system in said second operation mode.

12. The Performance Test Board according to claim 10 wherein the output voltage of each internal power supply source connected in parallel to said input terminal of said DC-DC-converter is adjusted to a power supply voltage of the device under test in said second operation mode.

13. The Performance Test Board according to claim 1 wherein the DC-DC-converter comprises a transistor having a first terminal connected to said input terminal of the DC-DC-converter, a second terminal connected to said output terminal of the DC-DC-converter, and a third terminal receiving a pulse width control signal generated by a pulse width control unit, wherein the pulse length of each signal pulse of said generated pulse width signal is proportional to a comparison result generated by a comparator which compares a voltage applied to said control terminal of said DC-DC-converter with a voltage at the output terminal of said DC-DC-converter.

14. The Performance Test Board according to claim 13 wherein the transistor is a MOSFET.

15. The Performance Test Board according to claim 14 wherein the second terminal of said MOSFET is connected via a diode to ground and via a low pass filter to said output terminal of said DC-DC-converter.

16. The Performance Test Board according to claim 15 wherein the low pass filter comprises an inductor between the second terminal of the transistor and said output terminal and a capacitor between said output terminal and ground.

17. Performance Test Board for connecting at least one device under test to a test system which has internal power supply sources wherein said Performance Test Board comprises at least one DC-DC-converter having an input terminal to which several internal power supply sources of said test system are connected in parallel, an output terminal to which a power supply terminal of said device under test is connected, wherein a control terminal of said DC-DC-converter is driven by an internal programmable voltage source generating an adjustable control voltage.

18. Performance Test Board according to claim 17 wherein the internal programmable voltage source is a Digital-Analog-converter.

* * * * *